US007736116B2

(12) United States Patent
Kozak

(10) Patent No.: US 7,736,116 B2
(45) Date of Patent: *Jun. 15, 2010

(54) AUTOMOBILE DISPLAY SYSTEM

(76) Inventor: Michael Kozak, Box 436, Battleford, Saskatchewan (CA) S0M 0E0

( * ) Notice: Subject to any disclaimer, the term of this patent is extended or adjusted under 35 U.S.C. 154(b) by 282 days.

This patent is subject to a terminal disclaimer.

(21) Appl. No.: 11/753,656

(22) Filed: May 25, 2007

(65) Prior Publication Data

US 2008/0069676 A1 Mar. 20, 2008

Related U.S. Application Data

(63) Continuation-in-part of application No. 10/986,807, filed on Nov. 15, 2004, now Pat. No. 7,164,434, which is a continuation-in-part of application No. 10/053,594, filed on Jan. 24, 2002, now abandoned.

(51) Int. Cl.
*H01L 21/687* (2006.01)

(52) U.S. Cl. ....................... 414/672; 414/639; 414/426; 414/259; 254/90

(58) Field of Classification Search .................. 104/35, 104/36, 39, 40–41, 43–44, 46; 187/203; 254/89 H, 89 R, 90, 93 L, 93 R; 410/1; 414/234, 414/238, 240, 253–255, 426, 628, 639, 662, 414/672; 475/167, 182
See application file for complete search history.

(56) References Cited

U.S. PATENT DOCUMENTS 1,436,766 A 11/1922 Kendrick
1,539,761 A * 5/1925 Murray ........................ 414/228
1,541,457 A * 6/1925 Winn ............................ 410/1
1,545,890 A * 7/1925 Fowler .......................... 410/1
1,784,554 A 12/1930 Stukenborg
1,889,185 A 11/1932 Stukenborg
1,951,118 A 3/1934 Ackerman
1,985,732 A 12/1934 Jauch et al.

(Continued)

FOREIGN PATENT DOCUMENTS

FR 2312219 12/1976

(Continued)

*Primary Examiner*—Gregory W Adams
(74) *Attorney, Agent, or Firm*—Ade & Company Inc.; Ryan W. Dupuis; Kyle R. Satterthwaite

(57) ABSTRACT

A vehicle display includes a base and a platform. A bearing between the base and the platform mounts the platform on the base for rotation about an upright axis. A rotator drive is provided for rotating the platform on the base. The apparatus also includes a base mounting column mounting the base on the ground. The column includes a lifting device for varying the height of the column between a lowered position with the platform substantially at ground level and a raised position with the platform positioned above ground level. With the column lowered, a vehicle may be driven onto the platform, tied down as necessary, lifted to the raised position and rotated for display purposes. This provides a simple drive on-drive off display that is visually very effective, easy to use and unobtrusive when not in use. In another embodiment, there may be provided a plurality of orbiting platforms supported circumferentially about a main platform for rotation about a respective orbiting axis of the orbiting platform and a main axis of the main platform.

6 Claims, 10 Drawing Sheets

U.S. PATENT DOCUMENTS

| | | | | |
|---|---|---|---|---|
| 2,015,357 | A | 9/1935 | Weaver | |
| 2,058,115 | A | 10/1936 | Wheeler | |
| 2,742,164 | A * | 4/1956 | Francis | 414/237 |
| 2,785,809 | A * | 3/1957 | Riblet | 414/246 |
| 2,915,143 | A * | 12/1959 | Simmons, Sr. | 414/233 |
| 2,952,221 | A | 9/1960 | Hobel | |
| 2,987,008 | A | 6/1961 | Melmer | |
| 3,160,230 | A | 12/1964 | Bacsanyi et al. | |
| 3,160,231 | A | 12/1964 | Bacsanyi et al. | |
| 3,566,798 | A | 3/1971 | Peitzman | |
| 3,590,505 | A | 7/1971 | Benchley, Jr | |
| 3,884,158 | A * | 5/1975 | Rumell | 410/1 |
| 4,020,767 | A | 5/1977 | Hardy | |
| 4,261,680 | A * | 4/1981 | Carnley et al. | 414/421 |
| 4,339,224 | A * | 7/1982 | Lamb | 414/501 |
| 4,519,493 | A | 5/1985 | Dyer | |
| 4,609,111 | A | 9/1986 | Astill | |
| 4,671,729 | A * | 6/1987 | McFarland | 414/462 |
| 4,726,240 | A * | 2/1988 | Brems | 74/27 |
| 4,787,802 | A | 11/1988 | Vaccaro et al. | |
| 5,015,146 | A | 5/1991 | Barnes et al. | |
| 5,062,368 | A | 11/1991 | Sticht et al. | |
| 5,074,829 | A * | 12/1991 | Menge, Sr. | 475/182 |
| 5,090,508 | A | 2/1992 | Nishikawa | |
| 5,127,336 | A | 7/1992 | Wakabayashi | |
| 5,286,156 | A | 2/1994 | Ikenouchi et al. | |
| 5,377,782 | A | 1/1995 | Francis et al. | |
| 5,573,083 | A | 11/1996 | Fletcher et al. | |
| 5,860,491 | A | 1/1999 | Fletcher | |
| 6,182,796 | B1 | 2/2001 | Perlstein et al. | |

FOREIGN PATENT DOCUMENTS

| | | |
|---|---|---|
| GB | 1408575 | 10/1975 |

* cited by examiner

AUTOMOBILE DISPLAY SYSTEM

This application is a continuation-in-part of application Ser. No. 10/986,807, filed Nov. 15, 2004, now U.S. Pat. No. 7,164,434 which is a continuation-in-part of application Ser. No. 10/053,594, filed Jan. 24, 2002 now abandoned.

FIELD OF THE INVENTION

The present invention relates to a rotating display and more particularly to a display for displaying a plurality of vehicles thereon, which can be supported on a lift for example.

BACKGROUND

A vehicle lift used for display purposes is disclosed in U.S. Pat. No. 5,015,146. The lift disclosed in that patent has a fixed column carrying a cantilever support for a vehicle. The vehicle may be mounted on the cantilever support, lifted and tilted for display purposes. This is in the nature of a fixed signage display.

Various examples of devices used generally for supporting a vehicle thereon are described in the following: U.S. Pat. No. 1,436,766 (Kendrick); U.S. Pat. No. 1,889,185 (Stukenborg); U.S. Pat. No. 1,951,118 (Ackerman); U.S. Pat. No. 1,985,732 (Jauch et al); U.S. Pat. No. 2,015,357 (Weaver); U.S. Pat. No. 3,160,231 (Bacsanyi et al); U.S. Pat. No. 3,590,505 (Benchley, Jr.); U.S. Pat. No. 4,609,111 (Astill); U.S. Pat. No. 5,090,508 (Nishikawa); GB 1,408,575 (Coleman); and FR 2,312,219 (British Turntable Company Ltd.). None provide a simple device capable of both lifting a vehicle and rotating the vehicle in the lifted position for display.

The present invention proposes a dynamic vehicle display with which a vehicle or a plurality of vehicles are rotated for display purposes.

SUMMARY

According to one aspect of the present invention there is provided a vehicle display device comprising:

a main platform supported on the ground and arranged for rotation about an upright main axis relative to the ground;

a plurality of orbiting platforms supported on the main platform circumferentially about the main axis, each orbiting platform being rotatable about a respective upright orbiting axis relative to the main platform and being arranged to support a vehicle thereon; and a rotator drive arranged for rotating the orbiting platforms about the main axis and about their respective orbiting platforms.

The orbiting platforms may be geared to rotate synchronously with one another relative to the main platform in which a turning ratio between the orbiting platforms and the main platform is 2 to 1.

The rotator drive preferably includes an orbiting gear coupled to rotate with each orbiting platform and a main gear fixed relative to the ground to which the orbiting gears are all operatively connected. The rotator drive may then be coupled to the main platform to rotate the main platform relative to the fixed gear and thereby drive rotation of all the platforms about their respective axes.

In the preferred embodiment there are two orbiting platforms diametrically opposed from one another on the main platform which are counter-rotating and oriented 90 degrees out of phase with one another for meshing interaction with one another.

In some embodiments, the platform may be tilted on the base, to provide a view of the vehicle in an inclined orientation.

A detailed description of some embodiments of the invention is given in the following. It is to be understood, however, that the invention is not be construed as limited to those embodiments.

BRIEF DESCRIPTION OF THE DRAWINGS

In the accompanying drawings, which illustrate exemplary embodiments of the present invention.

DETAILED DESCRIPTION

Figure 1:
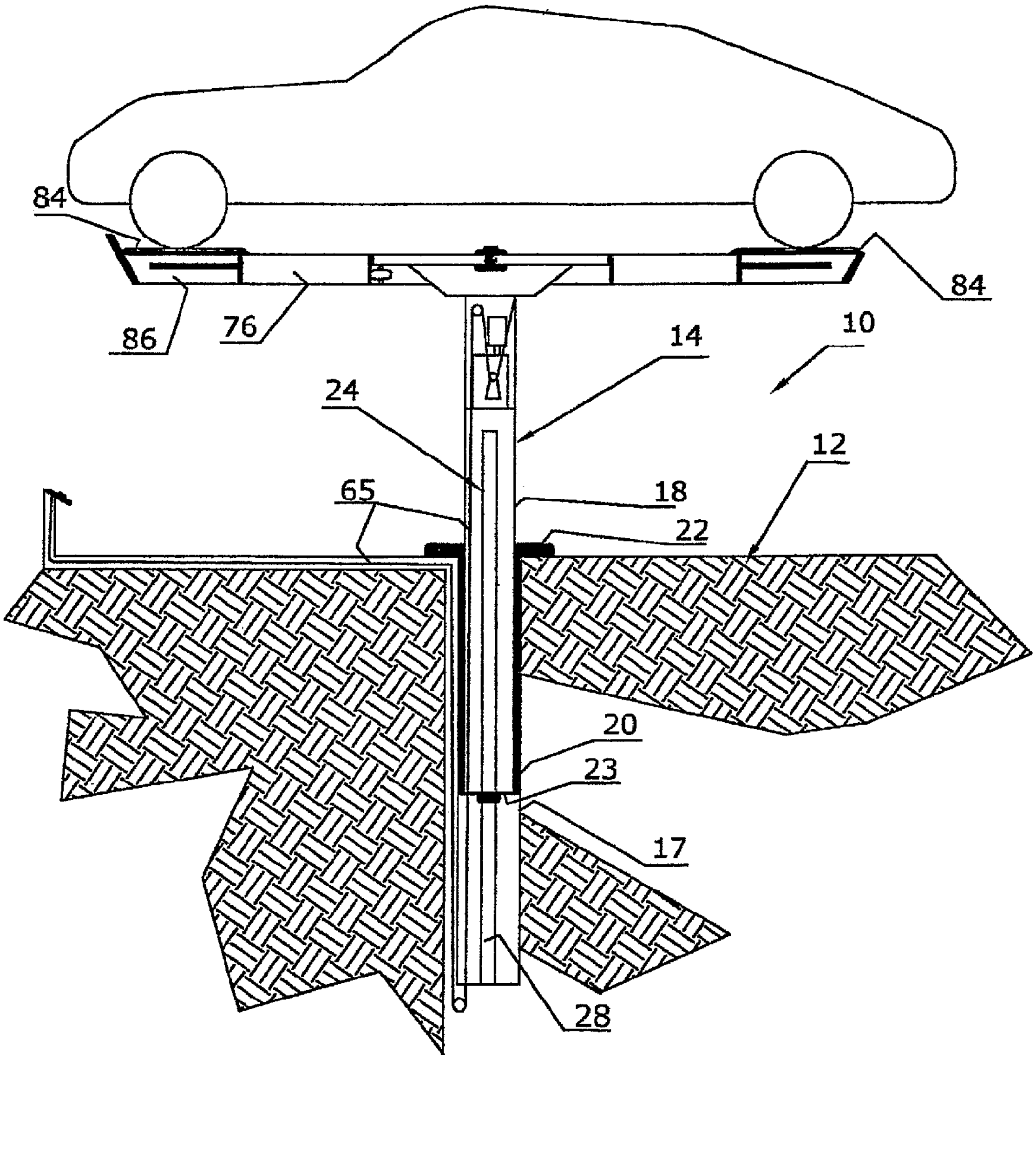
FIG. 1 is a side elevation of a first embodiment of the vehicle display lift and rotator device, showing the in-ground portion of the column set in to the ground.
Figure 2:
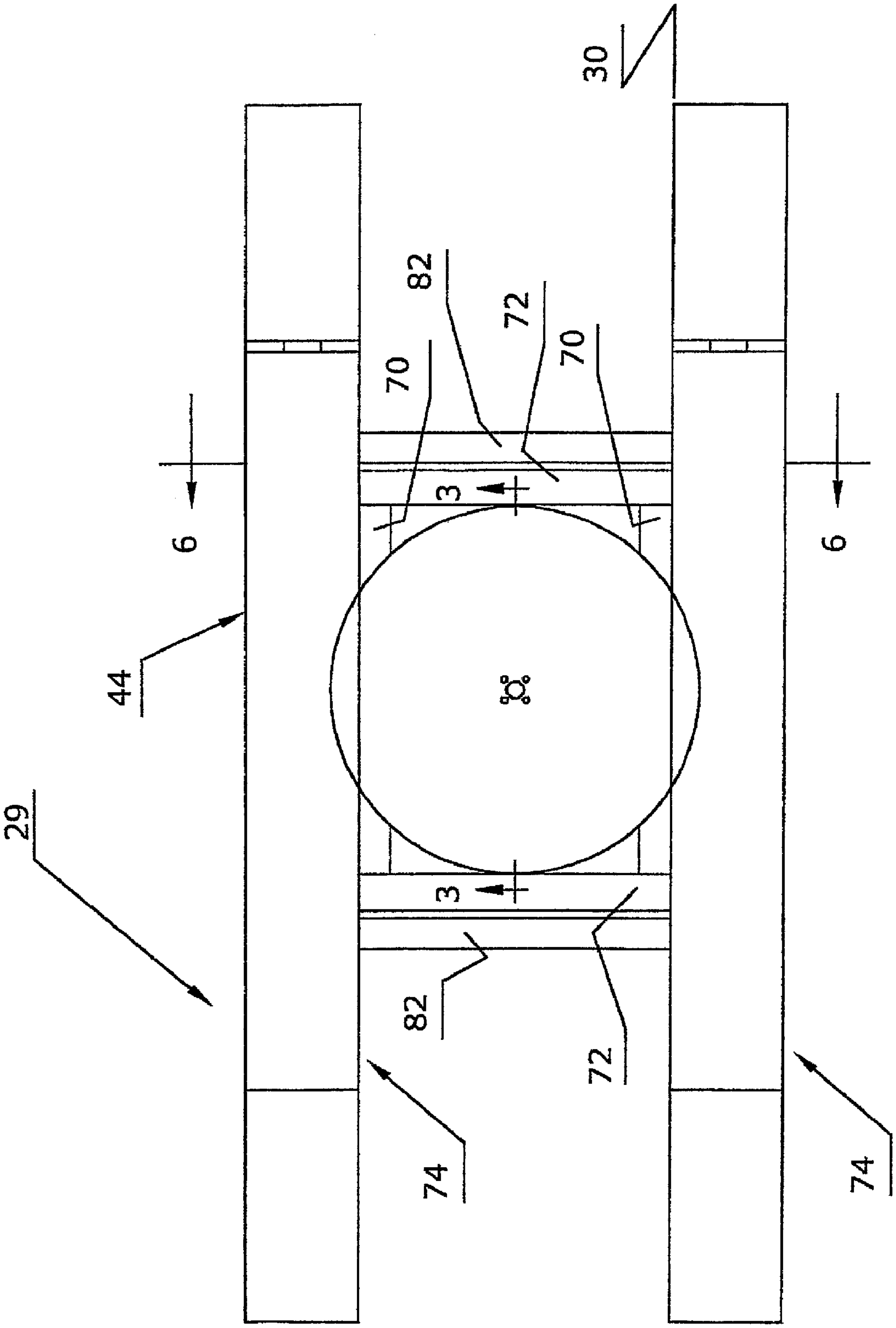
FIG. 2 is a plan view of the device.
Figure 3:
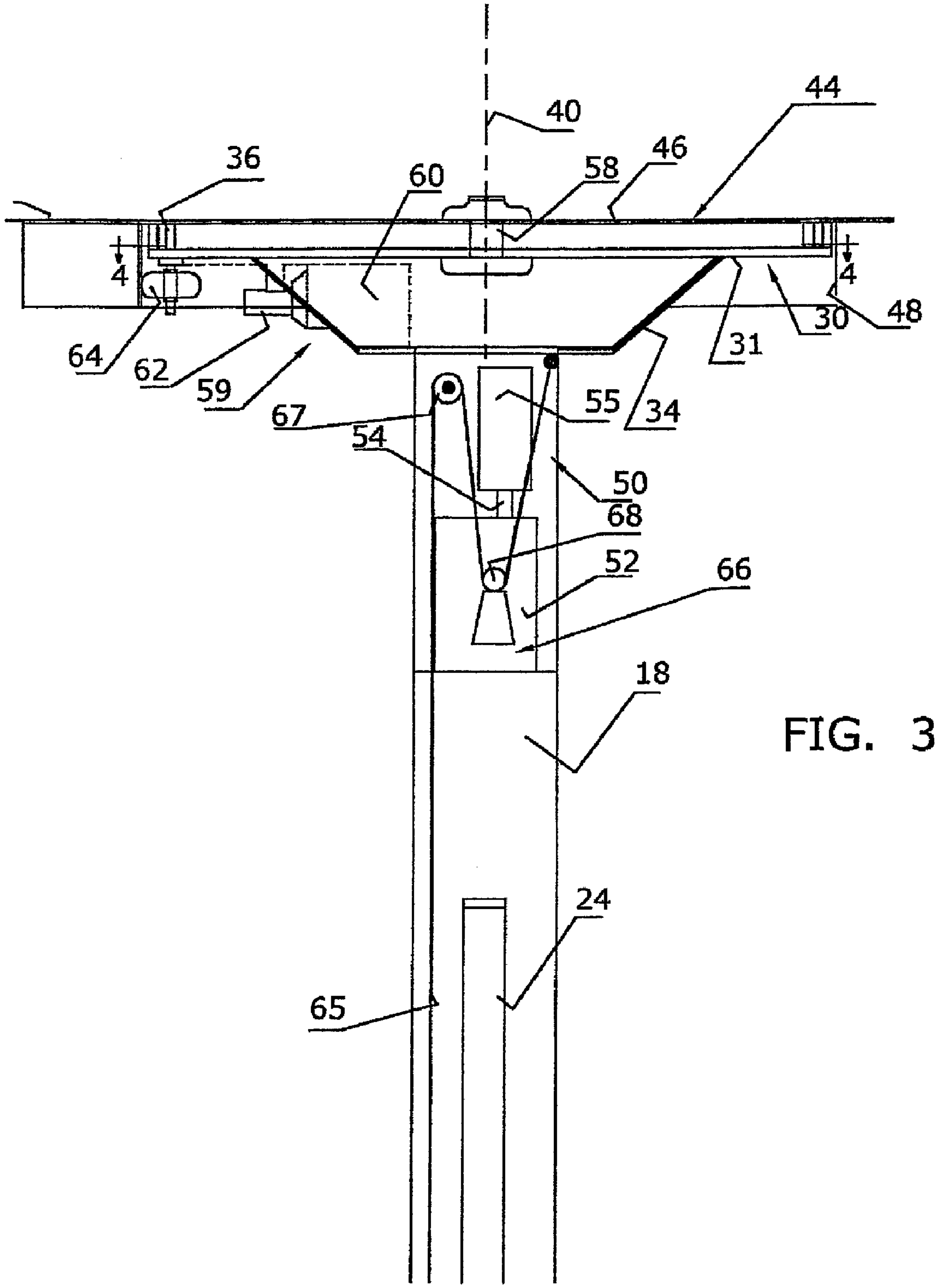
FIG. 3 is a detail cross-sectional elevation of the base and platform assembly along line 3-3 of FIG. 2.
Figure 4:
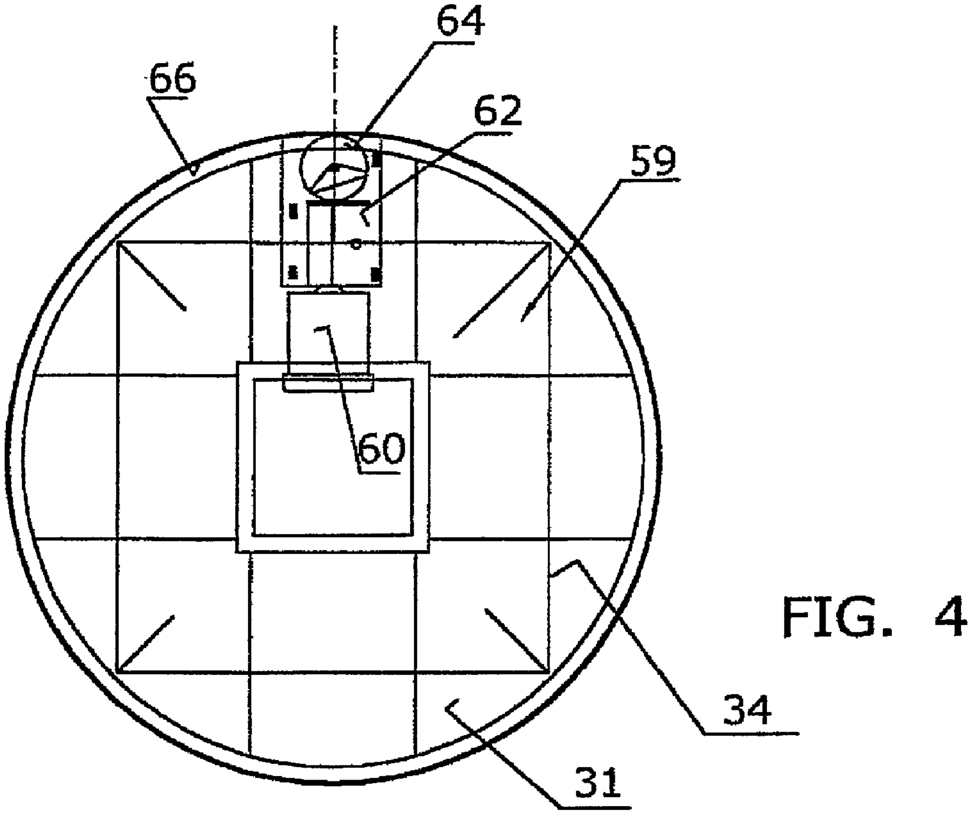
FIG. 4 is a cross-section along line 4-4 of FIG. 3.
Figure 5:
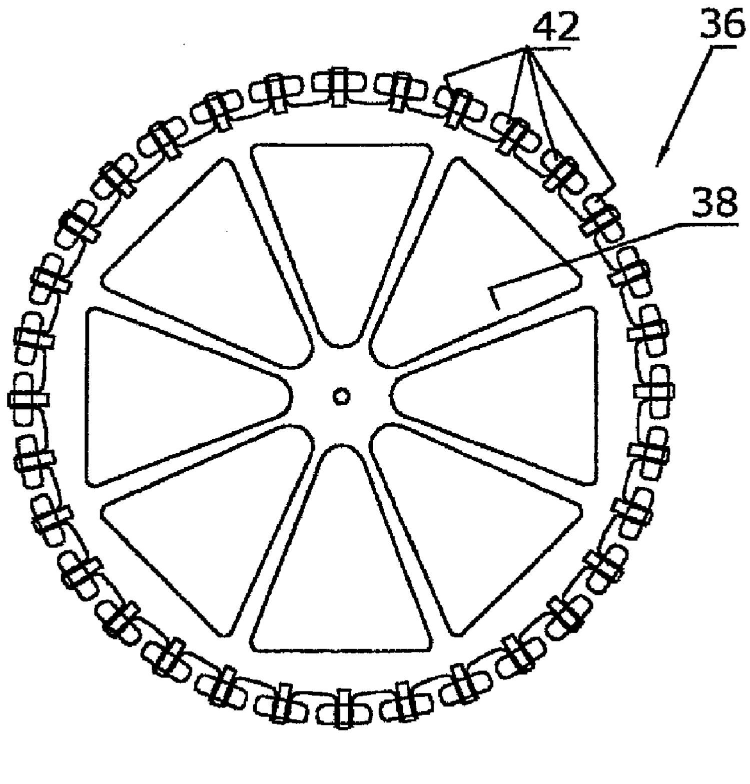
FIG. 5 is a plan view of the bearing roller assembly.
Figure 6:
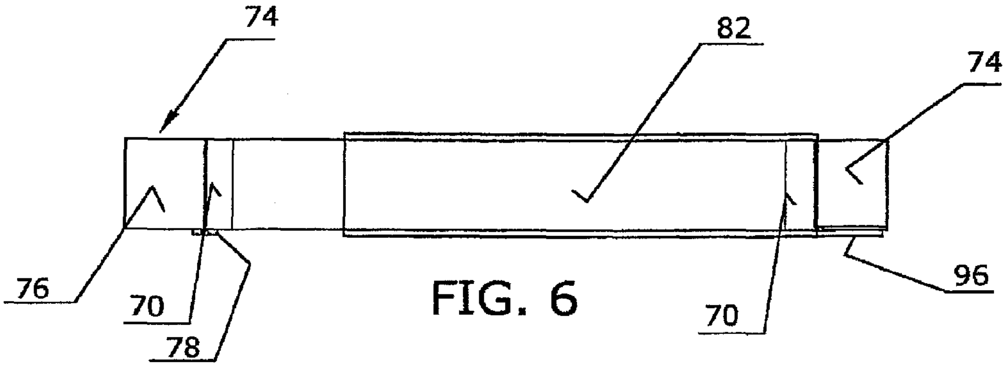
FIG. 6 is a sectional view along line 6-6 of FIG. 3 showing the platform in a horizontal orientation.

Referring to the accompanying drawings, there is illustrated a vehicle display rotator device generally indicated by reference number 10. Turning to a first embodiment of the present invention as shown in FIGS. 1 through 7, the device 10 is mounted in the ground 12. The mount is a column 14 projecting upwardly from the ground surface, which acts as a lifting mechanism.

The column 14 includes an outer tube 17 embedded in the ground and an inner tube 18 that slides vertically in the outer tube. Both tubes are of generally square cross section, which prevents their relative rotation. A bushing 20 is mounted on the inner tube near its bottom end. A second bearing and seal 22 is mounted on the upper end of the tube 17. The two bushings support the inner tube for vertical sliding movement. The inner tube has a closed bottom end 23. The movement of the inner tube in the outer tube is controlled with a hydraulic cylinder 24. The cylinder is mounted in the inner tube and has a rod 28 projecting from the closed bottom 23 to the bottom of the outer tube 17.

A rotator 29 is mounted on top of the inner tube 18. The rotator has a base 30, which includes a disk 31 mounted centrally across the top of the inner tube. The disk is supported on the tube by a downwardly tapering four sided housing 34.

A large annular bearing 36 is supported on top of the disk 31. This bearing includes a carrier plate 38 that is rotatable about a vertical rotator axis 40. It carries an annular array of rollers 42 that roll on the base, which serves as a lower race of the bearing. The rotator also has a platform 44, which includes a disk 46, concentric with the base disk 31 and the carrier plate 38. The disk 46 serves as the upper race of the bearing. A peripheral flange 48 projects downwardly from the edge of the platform disk, over the periphery of the base disk.

A hydraulic power unit 50 is mounted inside the inner tube 18. This includes a reservoir 52 for hydraulic fluid and a pump 54 and pump drive 55. This supplies the hydraulic fluid for operating the hydraulic cylinder 24.

An axle 58 connects the base disk 31 and the platform disk 46 on the vertical axis 40.

A rotator drive 59 includes an electric motor 60 mounted on the bottom of the base so as to be fixed relative to the ground and the components of the lift mechanism. The motor 60 drives a gear box 62 which in turn drives a pneumatic tire 64 engaging the inner surface of the peripheral flange 48 of the platform. The operation of this motor 60 rotates the platform 44 on the base 30 and the column 14. The tire provides a degree of cushioning in the drive to provide a relatively gentle start and stop for the platform rotation.

Power for operating the rotor drive and the hydraulic power unit is supplied through an underground electric cable 65 that runs up the inside of the column 14. At the top of the inner tube 18, the cable runs over a slack adjuster 66, which includes an idler 67 fixed to the inner tube and a floating, weighted idler 68.

The platform 44 includes an assembly 70 of two spaced apart tracks for supporting a vehicle on the platform. The assembly includes two base beams 70 joined by a pair of cross members 72. The tracks 74 are each composed of a tube 76 mounted on the base beams by a hinge 78 with a longitudinal hinge axis 80. The tubes 76 are connected by two cross members 82. Each carries two wheel pad units 84 for supporting a ground wheel of a vehicle. Each of the wheel pad units includes a wheel pad 84 mounted on an inner tube 86 that slides into an end of one of the tubes 76 to adjust the spacing between the wheel pads or to accommodate vehicles with different wheel bases. The cross members 82 may also be adjustable to accept vehicles with different track widths.

The tracks extend farther away from the rotator axis at one end of the platform than at the other end. Also, the wheel pads at opposite ends of each track, for supporting ground wheels of the vehicle, are positioned farther away from the rotator axis at one end of the platform than at the other end.

Figure 7:
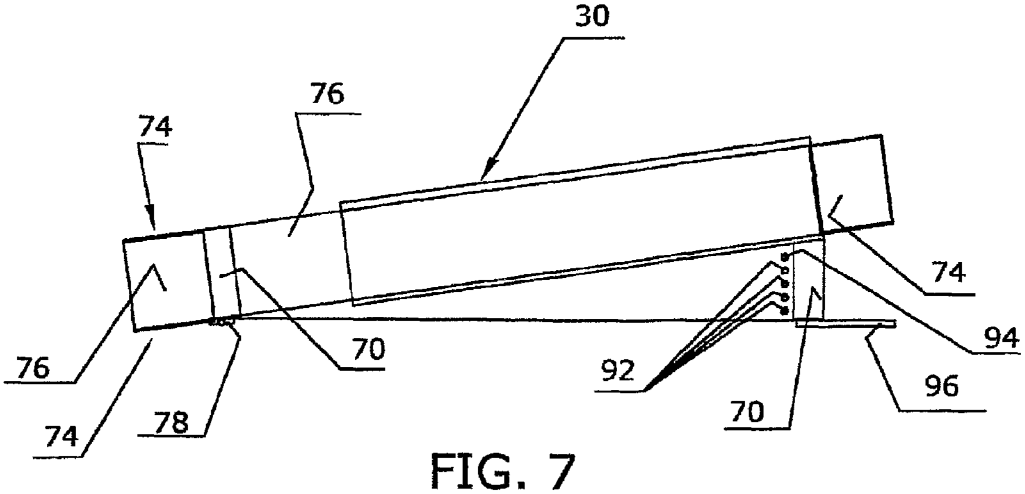
FIG. 7 is a sectional view along line 6-6 of FIG. 3 showing the platform in a tilted orientation.
Figure 8:
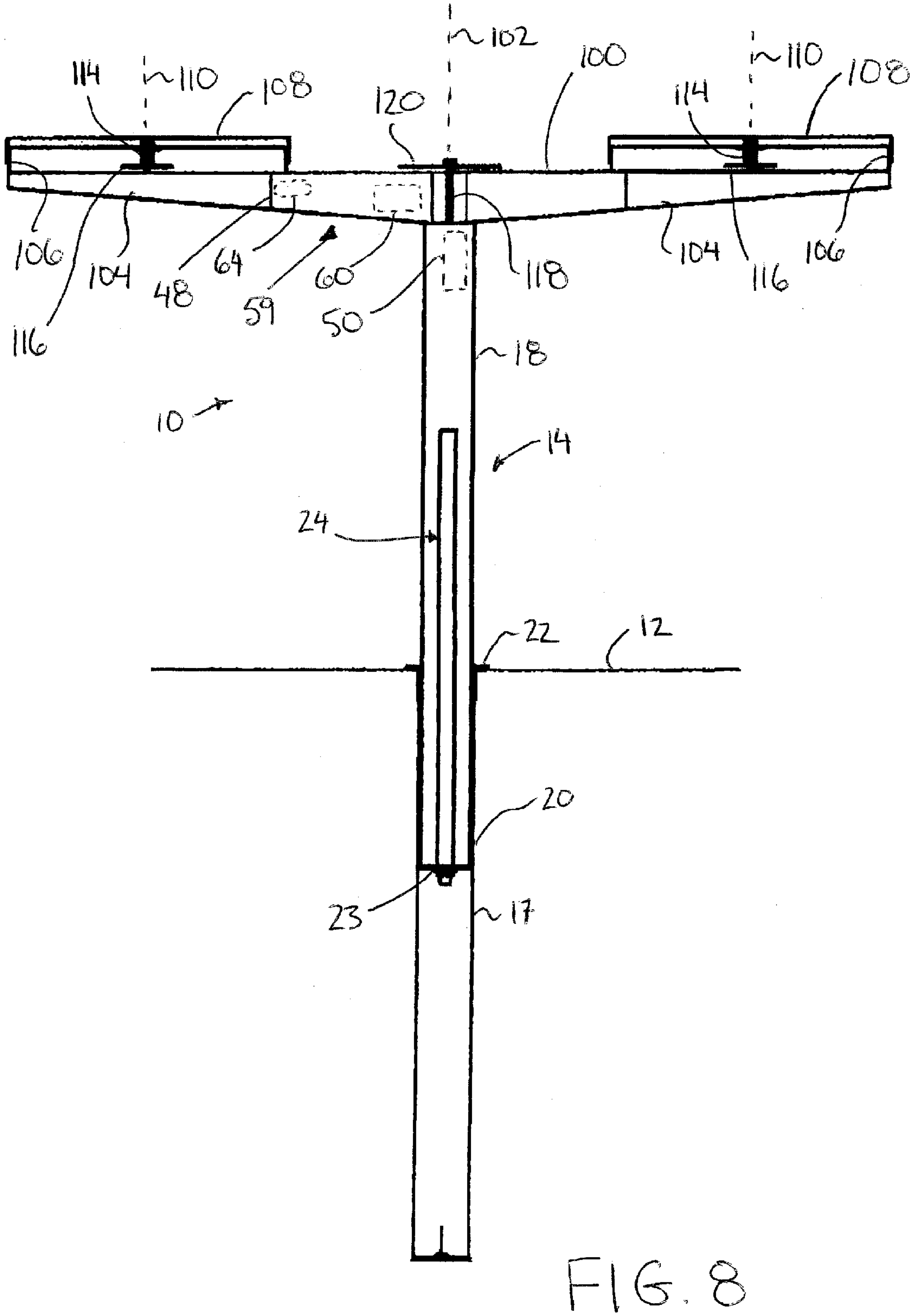
FIG. 8 is a side elevational view of a second embodiment of the device.
Figure 9:
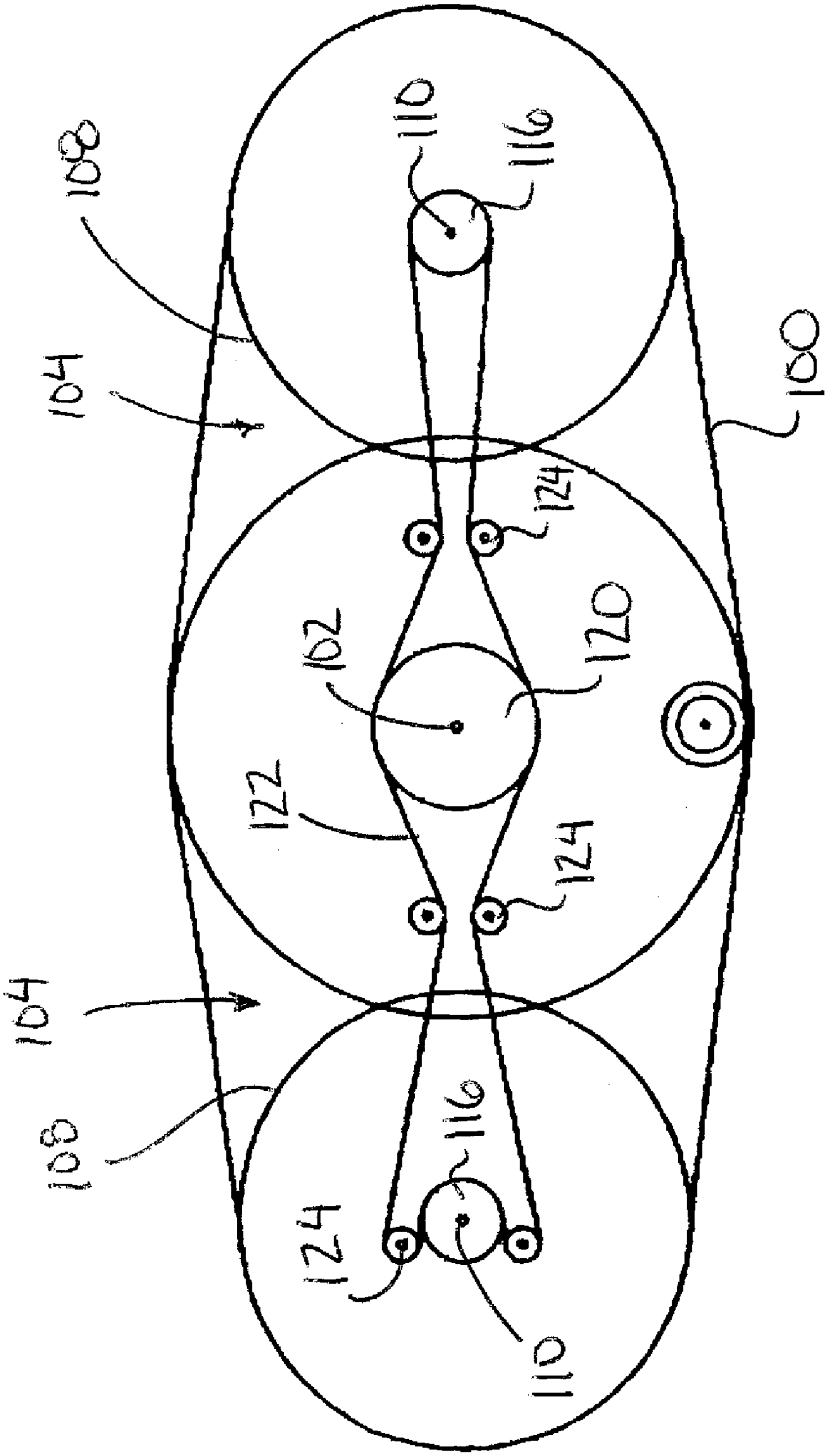
FIG. 9 is a schematic plan view of the platforms of the second embodiment.
Figure 12:
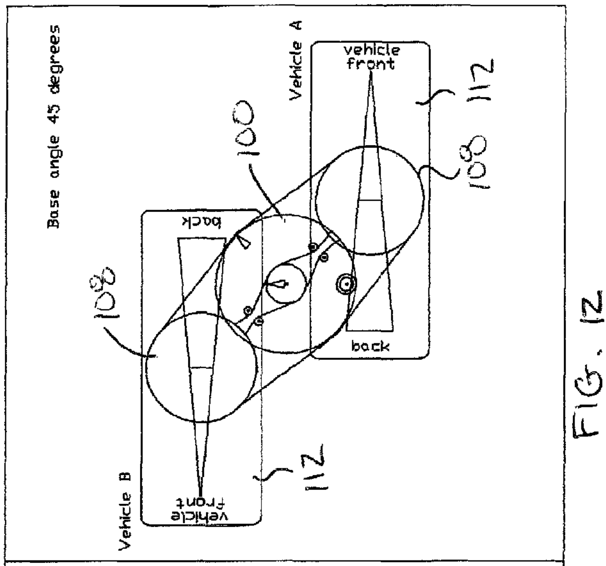
FIGS. 10 through 18 are schematic plan views of the platforms as the main platform is rotated relative to the ground in 22.5 degree increments.
Figure 11:
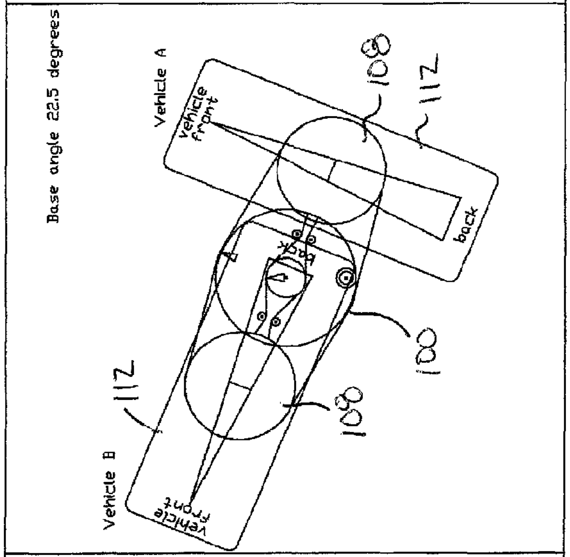
Figure 10:
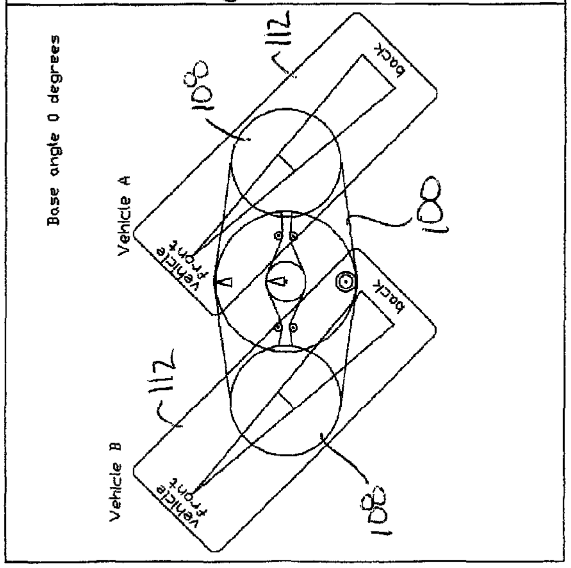
Figure 15:
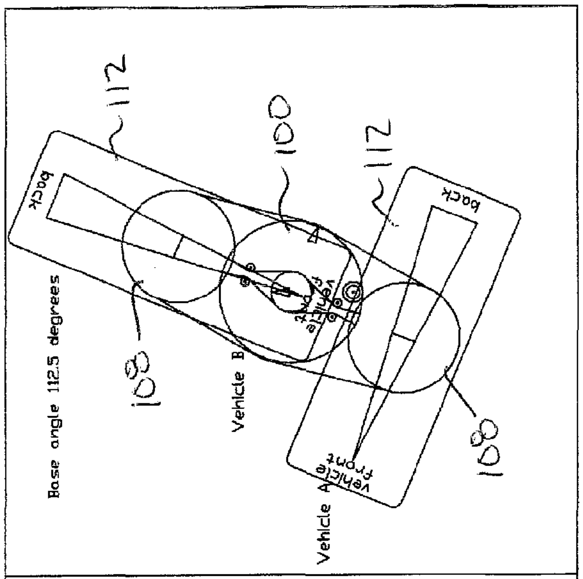
Figure 14:
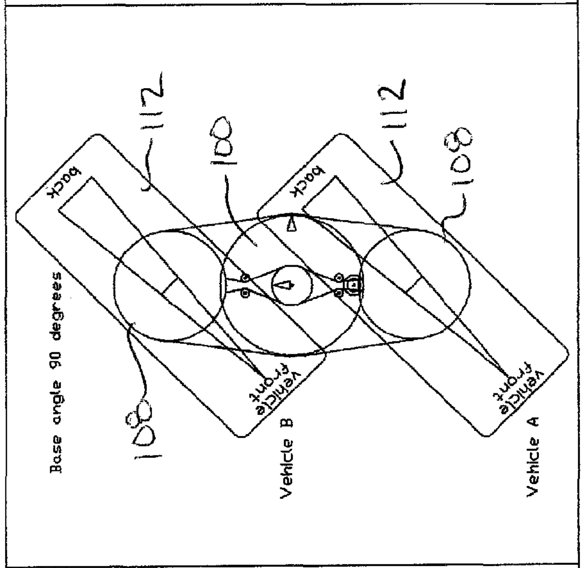
Figure 13:
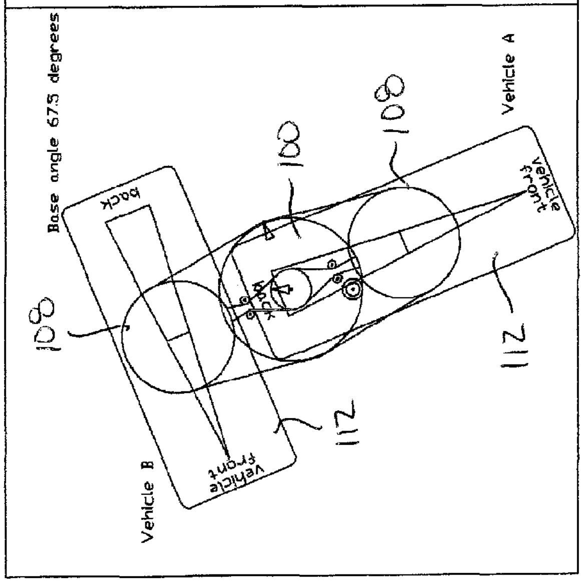
Figure 18:
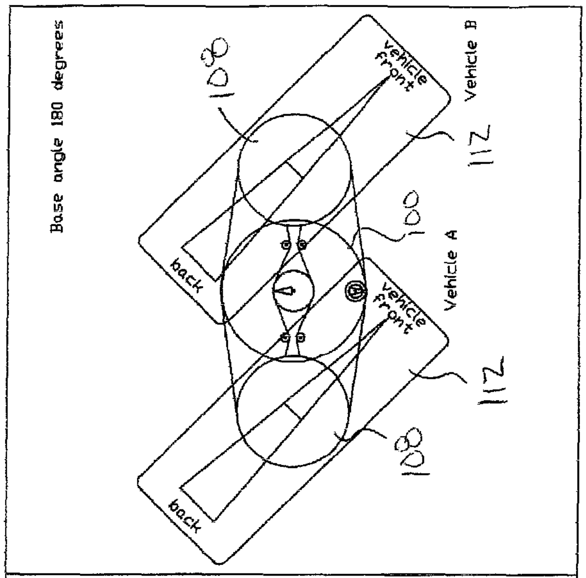
Figure 17:
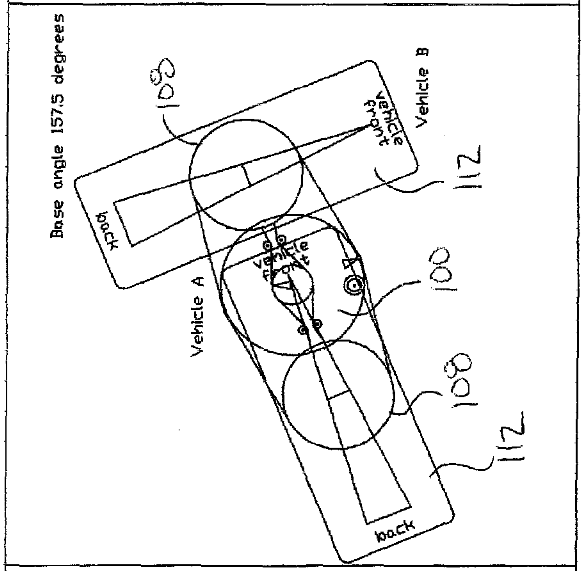
Figure 16:
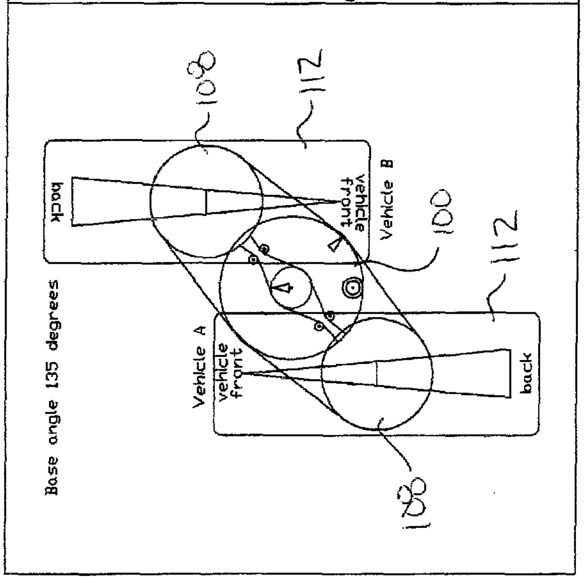

To adjust the lateral tilt of the tracks on the base, the beams 70 have respective sets of apertures 92 to accommodate pins 94 for supporting the tracks 74 at selected inclined positions as shown in FIG. 7. Stop plates 96 are mounted on the cross members 72 to limit the downward pivotal movement of the tracks 74.

Referring now to FIGS. 8 through 18 a second embodiment of the device 10 is illustrated. The lifting mechanism which supports the device 10 in the ground is substantially identical to the previous embodiment in which a column 14 is provided comprising an outer tube 17 slidably supporting an inner tube 18 therein. A bushing 20 and a seal 22 are similarly provided with a closed bottom end 23 on the inner tube to accommodate a hydraulic cylinder 24 operated by a hydraulic power unit 50.

The rotator is modified in the second embodiment to accommodate multiple vehicles. A main platform 100 is rotatably support about a main upright axis 102 concentric with the lift mechanism. The platform 100 is supported on the top end of the inner tube 18 similarly to the previous embodiment for rotation relative to the lift mechanism and to the ground. The rotator drive 59 is also similarly arranged with an electric motor 60 fixed relative to the lift mechanism for driving a pneumatic tire 64 engaging the inner surface of the peripheral flange 48 on the underside the platform.

In the second embodiment, the main platform 100 includes two wing portions 104 which extend laterally outwardly at diametrically opposed positions. Each wing portion 104 supports an annular bearing 106 thereon for rotatably supporting an orbiting platform on the main platform 100 for rotation about a respective orbiting axis. The orbiting platforms 108 are thus supported for rotation circumferentially about the main axis with the main platform and about the respective orbiting axes. Each of the annular bearing 106 is suitably sized for supporting the respective orbiting platform 108 thereon which is in the order of six feet in diameter. The orbiting platforms are spaced apart approximately seven feet from each other.

Each orbiting platform 108 includes a pair of tracks 112 supported therein which extend in a longitudinal direction beyond the periphery of the platform to permit a vehicle to be driven onto the pair of tracks 112 associated with each orbiting platform 108. The tracks forming the platform are typically in the order of fifteen feet long and six wide and are centered in both the lateral and longitudinal directions relative to the orbiting axis.

An orbiting shaft 114 is mounted on each platform 108 for rotation therewith relative to the main platform. Each orbiting shaft 114 carries an orbiting gear 116 thereon which is fixed to rotate with the respective orbiting platform 108.

A main shaft 118 supports a main gear 120 thereon so that the main gear is fixed relative to the inner tube 18 and secured against rotation relative to the ground. A drive chain 122 meshes with each of the orbiting gears 116 and the main gear 120 for operatively connecting the gears to rotate the orbiting gears 116 synchronously with one another relative to the main platform as the main platform is rotated relative to the ground by the rotator drive 59. A series of idler gears 124 are supported on the main platform for engaging the chain 122 to support and guide the chain while maintaining tension thereon throughout operation.

The chain 122 extends around the outer periphery of the main gear and one of the orbiting gears 116 at an outer side thereof, while extending around an inner side of the periphery of the opposing orbiting gear 116 so that the orbiting gears 116 are effectively geared to counter rotate relative to one another. One of the orbiting platforms 108 thus rotates in the same direction as the main platform while the other rotates in the opposite direction to the main platform.

The main gear 120 includes twice as many teeth as each of the orbiting gears 116 so that the gear ratio between each orbiting platform 108 and the main platform is two to one. One revolution of the main platform causes two revolutions of each orbiting platform relative to the main platform. Due to the counter rotating nature of one of the orbiting platforms, the overall rotation experienced by the two orbiting platforms 108 relative to the ground when the main platform does one full revolution is that one orbiting platform fully rotates once relative to the ground while the other fully rotates three times relative to the ground.

The tracks of the orbiting platforms 108 are oriented ninety degrees out of phase with one another and counter rotated so that the platforms effectively mesh with one another in an overlapping configuration with each rotation. The tracks are positioned close enough to one another that the vehicles would collide if not positioned ninety degrees out of phase with one another and counter rotated.

Turning now to FIGS. 10 through 18, the relative orientation of the two orbiting platforms are shown in 22.5 degree increments of the main platform rotation from one figure to the next to illustrate half of a full rotation of the main platform throughout the full sequence. As shown initially in FIG. 10, when the tracks of the two platforms are initially parallel to one another at a 45 degree inclination relative to an axis spanning between the two orbiting axes 110, the back end of both sets of tracks are oriented in the same direction. By rotating the main platform 180 degrees to the finishing position of FIG. 18, the two orbiting platforms effectively switch places and are each rotated one 180 degrees relative to their starting orientation so that vehicles driven onto the orbiting platforms along a drive on roadway can use the same roadway for driving off as the tracks are parallel between the positions of FIG. 10 and FIG. 18.

In both embodiments a lift mechanism, comprising an inner tube 18 and an outer tube 17 fixed against rotation relative to the ground, is used to raise and lower platforms suitable for supporting one or more vehicles thereon to permit the vehicles to be both raised for display and rotated while in the raised position in an aesthetically pleasing manner which captures the attention of potential customers to an automobile dealer. For simplicity, the rotator drive 59 in each instance is secured to the base of the platform and fixed against rotation relative to the lift mechanism so that no rotatable couplings are required. In each instance a main platform remains fully rotatably relative to the lift mechanism in the fully raised position.

While some embodiments of the present invention have been described in the foregoing, it is to be understood that other embodiments are possible within the scope of the invention. As discussed in the foregoing, it is possible to use the rotor as a stand-alone component where elevation of the vehicle for high visibility is not necessary. The invention is therefore to be considered limited solely by the scope of the appended claims.

The invention claimed is:

1. A vehicle display device in combination with a plurality of vehicles supported thereon, the vehicle display device comprising:

a base structure arranged to be supported on the ground;

a main platform rotatably supported on the base structure so as to be arranged for rotation about an upright main axis relative to the ground;

the main portion comprising a plurality of supporting portions extending outwardly in opposing directions to respective bearing members supported thereon;

a plurality of orbiting platforms supported on respective ones of the bearing members of the main platform located circumferentially about the main axis, each orbiting platform being supported by the respective bearing member for rotation about a respective upright orbiting axis relative to the main platform;

each orbiting platform supporting a respective one of the plurality of vehicles thereon and being arranged to permit the respective vehicle to be driven onto the platform; and a rotator drive comprising:

a main gear mounted in fixed relation to the base structure so as to be fixed against rotation in relation to the ground;

an orbiting gear mounted in fixed relation to each one of said plurality of orbiting platforms so as to be arranged to rotate with the respective orbiting platform in relation to the main platform;

each of the orbiting gears being operatively connected to the main gear so as to be arranged for rotation synchronously with one another relative to the main platform; and a drive motor arranged to drive rotation of the main platform in relation to the base structure about the main axis so as to be arranged to rotate the orbiting platforms therewith about the main axis and about their respective orbiting platforms by operative connection between the orbiting gears and the main gear.

2. A device according to claim 1 wherein a turning ratio between the orbiting platforms and the main platform is 2 to 1.

3. A device according to claim 1 wherein there are provided two orbiting platforms diametrically opposed from one another on the main platform.

4. A device according to claim 3 wherein the two orbiting platforms are counter-rotating and oriented 90 degrees out of phase with one another for meshing interaction with one another.

5. A device according to claim 1 wherein each orbiting platform includes tracks onto which the vehicle may be driven.

6. A device according to claim 1 wherein there is provided only two orbiting platforms supported diametrically opposite one another on the main platform and arranged to be rotated circumferentially about the main axis, the rotator drive being arranged to rotate the main platform supporting the orbiting platforms and the respective vehicles on the orbiting platforms about the main axis and being arranged to counter-rotate the two orbiting platforms and the respective vehicles supported on the orbiting platforms about the respective orbiting axes; the vehicles being supported on the orbiting platforms respectively so as to be oriented 90 degrees out of phase with one another and arranged to mesh with one another as the platforms are rotated.

* * * * *